(12) United States Patent
Bhattad et al.

(10) Patent No.: US 10,054,970 B2
(45) Date of Patent: Aug. 21, 2018

(54) ADAPTIVE GAIN CONTROL FOR VOLTAGE REGULATORS

(71) Applicant: Dialog Semiconductor (UK) Limited, London (GB)

(72) Inventors: Ambreesh Bhattad, Swindon (GB); Frank Kronmueller, Neudenau (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/289,225

(22) Filed: Oct. 10, 2016

(65) Prior Publication Data
US 2017/0212542 A1    Jul. 27, 2017

(30) Foreign Application Priority Data

Jan. 27, 2016    (DE) .................. 10 2016 201 171

(51) Int. Cl.
*G05F 1/575*    (2006.01)
*H03G 1/00*    (2006.01)
*H03F 3/45*    (2006.01)

(52) U.S. Cl.
CPC ......... *G05F 1/575* (2013.01); *H03F 3/45475* (2013.01); *H03G 1/0088* (2013.01)

(58) Field of Classification Search
CPC ... G05F 1/46; G05F 1/461; G05F 1/56; G05F 1/575; G05F 1/59; H03G 1/0005; H03G 1/0088; H03G 3/0004; H03G 3/007; H03G 3/30; G03G 3/3026; H03F 3/45071; H03F 3/45174; H03F 3/45475
See application file for complete search history.

(56) References Cited

U.S. PATENT DOCUMENTS 6,246,221 B1 *  6/2001  Xi ........................... G05F 1/575
                                                  323/280
7,205,827 B2 *  4/2007  Leung .................... G05F 1/575
                                                  323/280
(Continued)

FOREIGN PATENT DOCUMENTS

DE    10 2014 212 502    12/2015

OTHER PUBLICATIONS

German Office Action, File No. 10 2016 201 171.5, Applicant: Dialog Semiconductor (UK) Limited, dated Jun. 8, 2016, 8 pgs and English language translation, 11 pgs.

*Primary Examiner* — Matthew Nguyen
(74) *Attorney, Agent, or Firm* — Saile Ackerman LLC; Stephen B. Ackerman (57) ABSTRACT

A voltage regulator which provides an output current at an output voltage at an output node, based on an input voltage at an input node is described. The voltage regulator has an output amplification stage comprising a pass transistor for deriving the output current at the output node from the input voltage at the input node; and comprising a driver stage to set a gate voltage at a gate of the pass transistor based on a drive voltage. A gain of the output amplification stage is adjustable. Furthermore, the voltage regulator comprises a differential amplification unit to determine the drive voltage in dependence of the output voltage and in dependence of a reference voltage. In addition, the voltage regulator comprises a gain control circuit to adjust the gain of the output amplification stage in dependence of the output current.

26 Claims, 10 Drawing Sheets

(56) References Cited

U.S. PATENT DOCUMENTS

| | | |
|---|---|---|
| 2003/0178976 A1 | 9/2003 | Xi |
| 2005/0068092 A1 | 3/2005 | Sano |
| 2007/0057660 A1 | 3/2007 | Lin |
| 2012/0212199 A1 | 8/2012 | Amer et al. |
| 2013/0082672 A1* | 4/2013 | Kim ................ G05F 1/575 |
| | | 323/280 |
| 2013/0147447 A1 | 6/2013 | Liu et al. |
| 2014/0091775 A1* | 4/2014 | Tan ................. G05F 1/575 |
| | | 323/280 |

* cited by examiner

ADAPTIVE GAIN CONTROL FOR VOLTAGE REGULATORS

TECHNICAL FIELD

The present document relates to a voltage regulator. In particular, the present document relates to a voltage regulator exhibiting reduced internal losses and/or reduced dropout voltages.

BACKGROUND

Voltage regulators are frequently used for providing a load current at a stable load voltage to different types of loads (e.g. to the processors of an electronic device). A voltage regulator derives the load current from an input node of the regulator, while regulating the output voltage at the output node of the regulator in accordance to a reference voltage.

SUMMARY

The present document addresses the technical problem of providing a voltage regulator which exhibits reduced internal losses and/or which enables reduced drop-out voltages. According to an aspect, a regulator (notably a voltage regulator such as a linear dropout regulator) is described. The regulator is configured to provide at an output node of the regulator an output current (referred to herein as $I_{OUT}$) at an output voltage (referred to herein as $V_{OUT}$). The output node of the regulator may be coupled to a load (e.g. to a processor) which is to be operated using the load current. The output current is derived from an input voltage (referred to herein as $V_{IN}$) at an input node of the regulator.

The regulator (notably the voltage regulator) comprises an output amplification stage. The output amplification stage comprises a pass transistor (e.g. an n-type metal oxide semiconductor transistor) for providing the output current at the output node from an input voltage at the input node of the regulator. The input node may correspond to a drain of the pass transistor and the output node may correspond to a source of the pass transistor. Furthermore, the output amplification stage comprises a driver stage which is configured to set a gate voltage at a gate of the pass transistor based on a drive voltage (referred to herein as $V_{DRIVE\_S3}$). The driver stage may comprise a drive transistor (e.g. an NMOS transistor) having a gate that is coupled to the gate of the pass transistor, having a source that is coupled to a source of the pass transistor, and having a drain that is coupled to the gate of the drive transistor. Hence, the drive transistor and the pass transistor may form a current mirror.

Furthermore, the voltage regulator comprises a differential amplification unit which is configured to determine the drive voltage in dependence of the output voltage and in dependence of a reference voltage. In particular, the differential amplification unit may be configured to determine the drive voltage in dependence of the difference between a feedback voltage (which is proportional to the output voltage) and the reference voltage.

A gain of the output amplification stage (referred to herein as $G_{OUT}$) is adjustable. The adjustable gain may e.g. be implemented using an adjustable mirror ratio of the current mirror which is formed by the drive transistor and the pass transistor. The regulator further comprises a gain control circuit which is configured to adjust the gain of the output amplification stage in dependence of the output current. For this purpose, the gain control circuit may be configured to sense the output current (e.g. using current sensing means such as a scaled copy of the pass transistor). The gain may then be adjusted using the sensed output current.

By adjusting the gain of the output amplification stage based on the output current, the internal losses of the voltage regulator may be reduced, while at the same time maintaining a fast transient response and stability of the voltage regulator. In particular, the gain control circuit may be configured to adjust the gain such that the gain increases with increasing output current and decreases with decreasing output current, thereby achieving a good compromise between stability, speed and power consumption of the voltage regulator.

Alternatively or in addition, the gain control circuit may be configured to adjust the gain in dependence of the input voltage and/or in dependence of the output voltage, notably in dependence of a difference between the input voltage and the output voltage. In particular, the gain control circuit may be configured to increase the gain, if an absolute value of the difference between the output voltage and the input voltage decreases or if a value of the input voltage decreases.

Alternatively or in addition, the gain control circuit may be configured to decrease the gain, if an absolute value of the difference between the output voltage and the input voltage increases or if a value of the input voltage increases. By doing this, the voltage regulator may be enabled for regulation with relatively small differences between the input voltage and the output voltage (i.e. for small dropout voltages), as may occur e.g. in case of a decrease of the input voltage.

The gain control circuit may be configured to adjust the gain of the output amplification stage by a gain delta if the output current changes by a current delta. A ratio of the gain delta and the current delta may be equal to or smaller than a pre-determined transition threshold. The pre-determined transition threshold may be set to ensure stability of the voltage regulator. In other words, the gain control circuit may be configured to perform a gradual increase/decrease of the gain across a certain interval of values of the output current. By doing this, stable regulation of the voltage regulator may be ensured, even if the gain of the output amplification stage is adjusted.

By way of example, the output amplification stage may exhibit a minimum gain value and a maximum gain value for the gain of the output amplification stage. The gain control circuit may be configured to adjust the gain from the minimum gain value to the maximum gain value (or vice versa) across a transition range of values of the output current. The width of the transition range may be determined based on stability measurements of the voltage regulator. In particular, the transition range may be sufficiently wide to ensure stability of the voltage regulator, even for changing gains of the output amplification stage. This may be ensured by selecting the transition range based on stability measurements.

A minimum current value and/or a maximum current value of the transition range may depend on the input voltage and/or on an absolute value of a difference between the output voltage and the input voltage. By doing this, the voltage regulator may be enabled for regulation with relatively small differences between the input voltage and the output voltage, as may occur e.g. in case of a decrease of the input voltage.

As indicated above, the driver stage typically comprises a drive transistor which forms a current mirror with the pass transistor. The gain of the output amplification stage may be dependent on, notably equal to, a mirror ratio of the current mirror. As such, the gain of the output amplification stage may be adjusted by adjusting the mirror ratio of the current mirror.

By way of example, the current mirror may comprise an adjustable resistance between the drain of the drive transistor and the gate of the pass transistor. The gain control unit may be configured to control the adjustable resistance to control the gain of the output amplification stage. The adjustable resistance may e.g. comprise an auxiliary transistor, and the gain control unit may be configured to control a voltage which is applied to a gate of the auxiliary transistor (thereby adjusting the on-resistance of the auxiliary transistor). An adjustable resistance within the current mirror provides efficient means for adjusting the gain of the output amplification stage.

The gain control unit may be configured to adjust an effective size of the drive transistor to adjust the mirror ratio of the current mirror. Alternatively or in addition, the gain control unit may be configured to adjust a gain of the drive transistor to adjust the mirror ratio of the current mirror. Alternatively or in addition, the drive transistor may comprise a plurality of constituting transistors and the gain control unit may be configured to enable and/or disable one or more constituting transistors to adjust the mirror ratio of the current mirror. As such, various different means may be provided to adjust the gain of the output amplification stage.

The driver stage may comprise an input transistor which is controlled by the drive voltage to set an internal current of the driver stage. The input transistor and the drive transistor may be arranged in series with respect to one another, such that the internal current corresponds to the current through the input transistor and to the current through the drive transistor. The gain of the output amplification stage may be proportional to a ratio of the output current and the internal current.

According to a further aspect, a method for providing an output current at an output voltage at an output node of a regulator, based on an input voltage at an input node of the regulator is described. The method comprises deriving the output current at the output node from the input voltage at the input node using a pass transistor. Furthermore, the method comprises setting a gate voltage at a gate of the pass transistor based on a drive voltage. In addition, the method comprises determining the drive voltage in dependence of the output voltage and in dependence of a reference voltage. The method further comprises adjusting a gain between the drive voltage and the gate voltage in dependence of the output current.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1A:
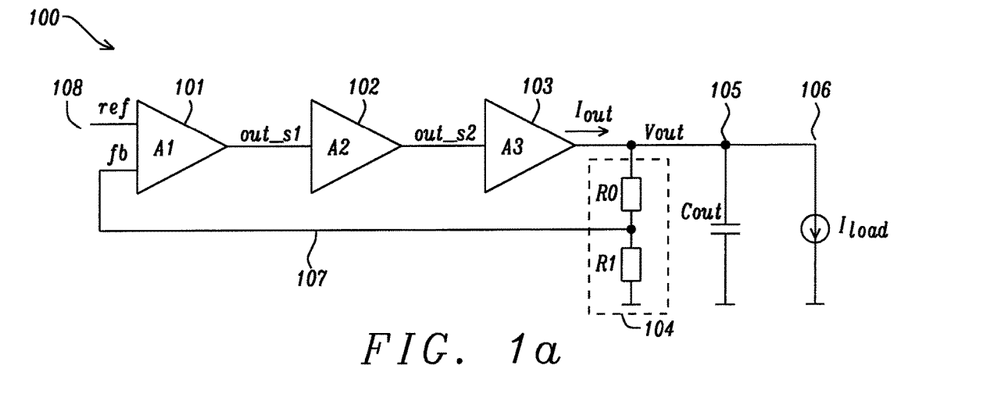
FIG. 1a illustrates an example block diagram of an LDO regulator.

As outlined above, the present document is directed at providing a voltage regulator with reduced internal losses. An example of a voltage regulator is an LDO regulator. A typical LDO regulator 100 is illustrated in FIG. 1a. The LDO regulator 100 comprises an output amplification stage or output stage 103, comprising e.g. a field-effect transistor (FET), at the output and a differential amplification stage 101 (also referred to as error amplifier) at the input. A first input (fb) 107 of the differential amplification stage 101 receives a fraction of the output voltage $V_{OUT}$ determined by the voltage divider 104 comprising resistors R0 and R1. The second input (ref) to the differential amplification stage 101 is a stable voltage reference $V_{ref}$ 108 (also referred to as the bandgap reference). If the output voltage $V_{OUT}$ changes relative to the reference voltage $V_{ref}$, the drive voltage to the output amplification stage, e.g. to the power FET, changes by a feedback mechanism called main feedback loop to maintain a constant output voltage $V_{OUT}$.

The LDO regulator 100 of FIG. 1a further comprises an additional intermediate amplification stage 102 configured to amplify the output voltage of the differential amplification stage 101. An intermediate amplification stage 102 may be used to provide an additional gain within the amplification path. Furthermore, the intermediate amplification stage 102 may provide a phase inversion.

In addition, the LDO regulator 100 may comprise an output capacitance $C_{out}$ (also referred to as output capacitor or stabilization capacitor or bypass capacitor) 105 parallel to the load 106. The output capacitor 105 is used to stabilize the output voltage $V_{OUT}$ subject to a change of the load 106, in particular subject to a change of the requested load current or output current $I_{load}/I_{OUT}$.

Figure 1B:
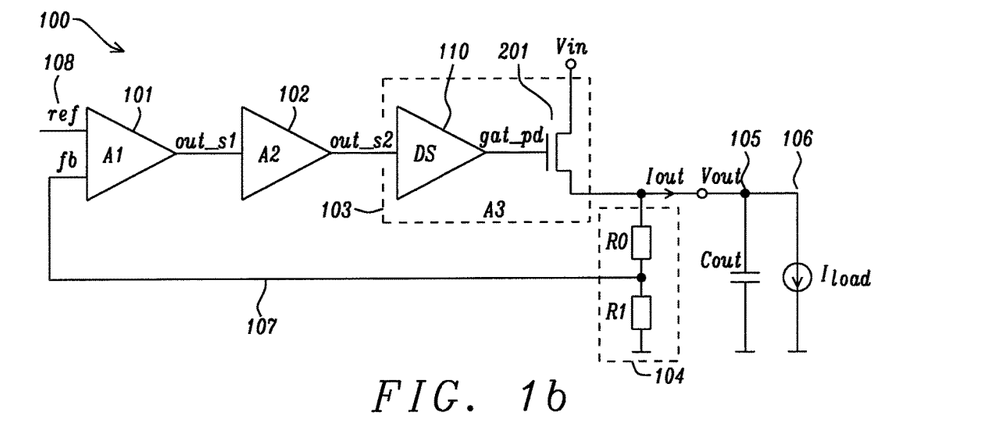
FIG. 1b illustrates the example block diagram of an LDO regulator in more detail.

FIG. 1b illustrates the block diagram of a LDO regulator 100, wherein the output amplification stage 103 is depicted in more detail. In particular, the pass transistor or pass device 201 and the driver stage 110 of the output amplification stage 103 are shown. Typical parameters of an LDO regulator 100 are a supply voltage of 3V, an output voltage of 2V, and an output current or load current ranging from 1 mA to 100 or 200 mA. Other configurations are possible.

Figure 1C:
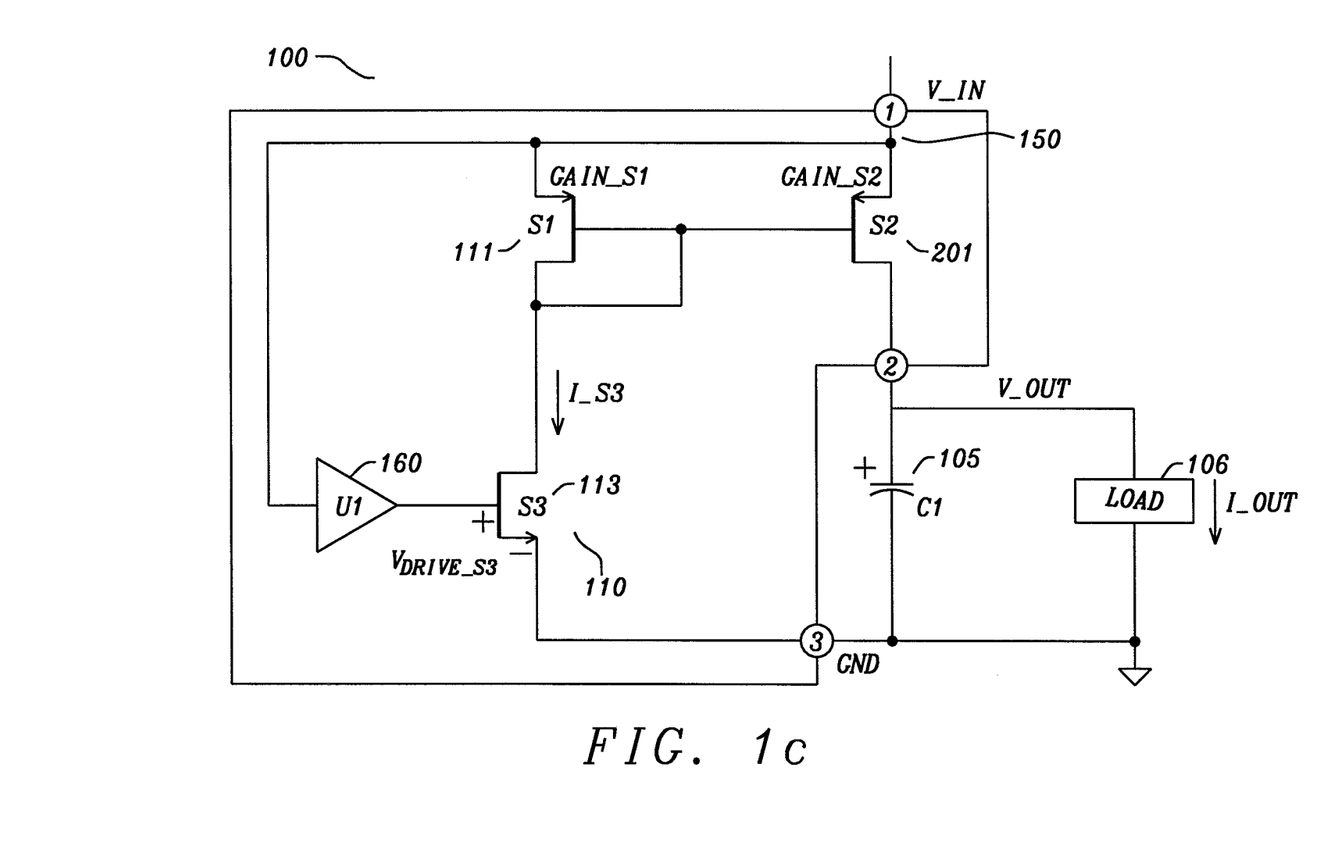
FIG. 1c shows another block diagram of an LDO regulator.

FIG. 1c shows further details of the driver stage 110. The driver stage 110 comprises a drive transistor 111 (e.g. a p-type metal oxide semiconductor, PMOS, transistor) which is operated as a diode (i.e. the drain of the drive transistor 111 is coupled to the gate of the drive transistor 111). The gate of the drive transistor 111 is coupled to the gate of the pass transistor 201. Furthermore, the source of the drive transistor 111 is coupled to the source of the pass transistor 201, which corresponds to the input node 150 of the regulator 100. The drain of the pass transistor 201 corresponds to the output node of the regulator 100.

The driver stage 110 further comprises an input transistor 113 (e.g. an n-type MOS or NMOS transistor) which is arranged in series with the drive transistor 111, such that the current I_S3 through the drive transistor 111 corresponds to the current through the input transistor 113. This current is referred to herein as the internal current. The serial arrangement of the drive transistor 111 and the input transistor 113 may be arranged between the input node 150 and ground GND. The gate of the input transistor 113 is controlled by the output of the differential amplification unit 160 (which comprises e.g. the differential amplification stage 101 and the intermediate amplification stage 102). The voltage at the output of the differential amplification unit 160 is referred to herein as the drive voltage $V_{DRIVE\_S3}$.

FIG. 1c also illustrates different terminals of the regulator 100, notably an input terminal or input node (denominated as 1 in FIG. 1c) which is coupled to an unregulated input voltage $V_{IN}$, an output terminal or output node (denominated as 2 in FIG. 1c) which provides the regulated output voltage $V_{OUT}$ and a ground terminal (denominated as 3 in FIG. 1c) which is coupled to ground GND.

The drive transistor 111 and the pass transistor 201 form a current mirror having a certain gain which corresponds to the ratio of the gain (GAIN_S1) of the drive transistor 111 and the gain (GAIN_S2) of the pass transistor 201. This ratio of the gain of the drive transistor 111 and of the gain of the pass transistor 201 determines the ratio of the output current (I_OUT or $I_{OUT}$) at the output terminal of the regulator 100 and the internal current (I_S3 or $I_{S3}$) through the drive transistor 111. The gain GAIN_S2:GAIN_S1 may be noted as $G_{OUT}$ (referred to as the gain of the output amplification stage), and the output current is given as $G_{OUT}$ times the internal current, i.e. $I_{OUT}=G_{OUT}*I_{S3}$.

The drive transistor 111 and/or the pass transistor 201 may each be made up of multiple switch devices which are connected in a parallel configuration. For simplicity, the entire drive transistor structure (comprising a plurality of parallel contributing transistors) is referred to herein as a drive transistor S1.111. Similarly, the entire external pass transistor structure (comprising a plurality of parallel contributing transistors) is referred to herein as a pass transistor S2 201. The gain ratio $G_{OUT}$=GAIN_S2:GAIN_S1 is typically fixed, such that the ratio of the output current (I_OUT) and of the internal current (I_S3) is also fixed.

The operation of a regulator 100 with a fixed gain or gain ratio $G_{OUT}$ is illustrated in the waveforms shown in FIGS. 2 and 3. FIGS. 2a and 3a show the ratio between the gain of the pass transistor S2 201 and the gain of the drive transistor S1 111, which remains constant across the entire range of the output load, i.e. across the entire range of the output current I_OUT or $I_{OUT}$. FIGS. 2b and 3b show the linear relationship between the output current (I_OUT) and the internal current (I_S3). As a result of this, the internal loss of the regulator 100 increases linearly with the output current I_OUT, wherein the internal loss (measured in Watt) is given by:

Internal Loss=(I_S3)×(R_{DS(ON)}_S1+R_{DS(ON)}_S3), with $R_{DS(ON)}$_S1 being the on-resistance of the drive transistor 111 and with $R_{DS(ON)}$_S3 being the on-resistance of the input transistor 113.

Figure 2A:
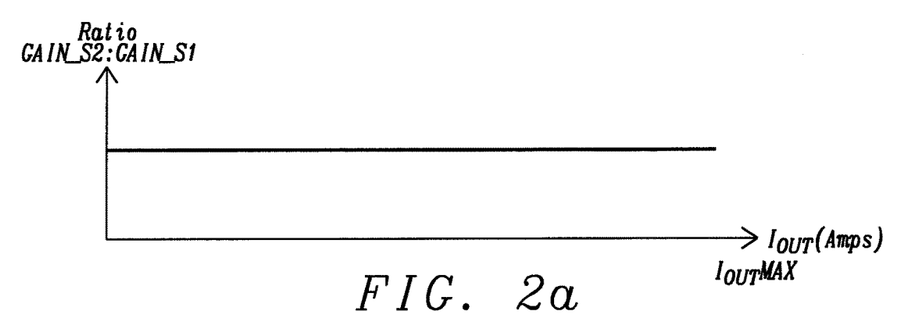
FIGS. 2a, 2b, 2c, 2d show example measurement signals during the operation of an LDO regulator.
Figure 2B:
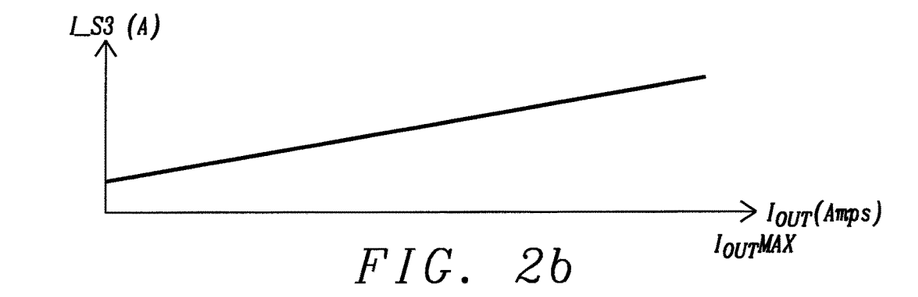
Figure 2C:
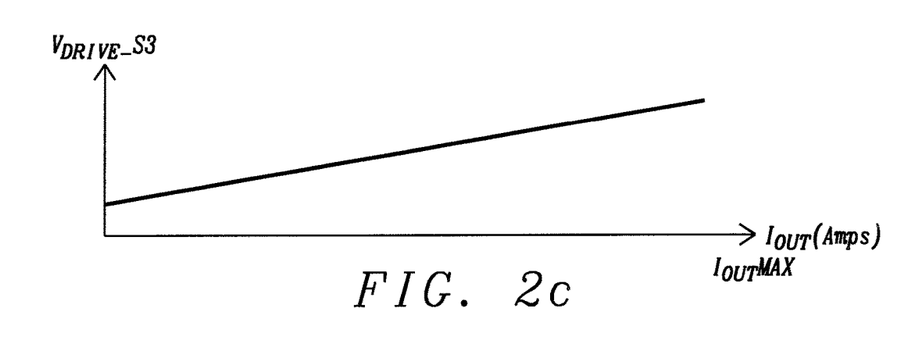
Figure 2D:
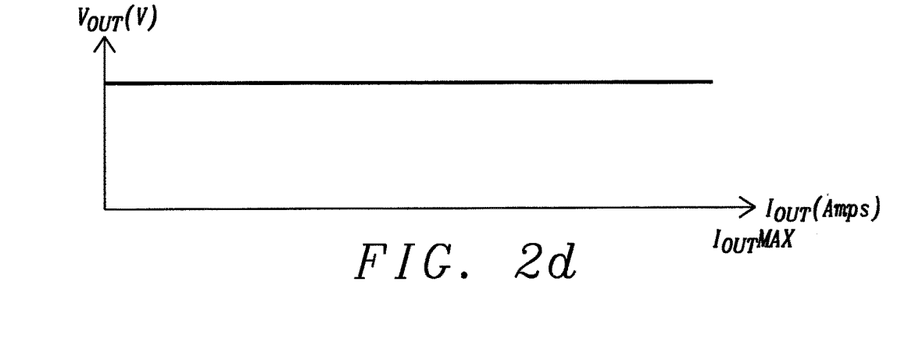

FIG. 2d illustrates the regulated output voltage V_OUT or $V_{OUT}$ as a function of the output current I_OUT. FIG. 2c illustrates that the differential amplification unit U1 160 increases the drive voltage $V_{DRIVE\_S3}$ at the gate of the input transistor S3 113 as a function of output current $I_{OUT}$ in a linear manner, in order to linearly increasing the internal current I_S3 through the input transistor 113. In other words, increasing output currents $I_{OUT}$ lead to increasing drive voltages $V_{DRIVE\_S3}$.

As mentioned above, the input voltage V_IN or $V_{IN}$ is typically unregulated. In the case of a portable electronic device, the input voltage V_IN is typically provided by a rechargeable battery. As the battery discharges, the level of the input voltage V_IN reduces. FIG. 3 illustrates the operation of a linear regulator 100 when the level of the input voltage V_IN reduces to a level which is insufficient for supporting the requirements of the output load 106. The arrow in FIG. 3c illustrates the decrease of the input voltage V_IN, which may be due e.g. to discharging of the battery of an electronic device which comprises the regulator 100.

Figure 3A:
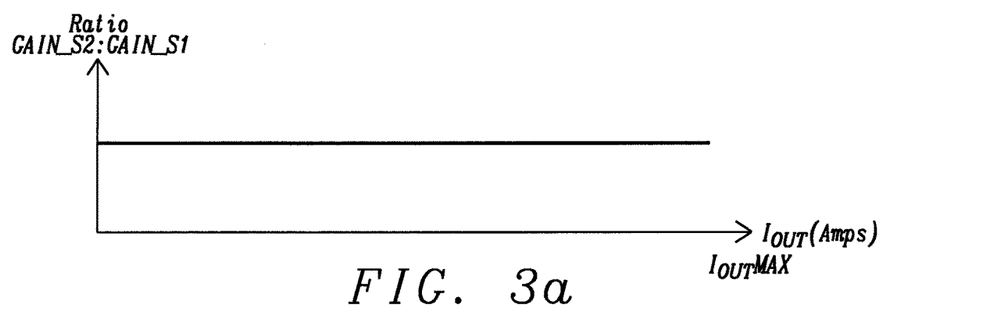
FIGS. 3a, 3b, 3c, 3d show further example measurement signals during the operation of an LDO regulator.
Figure 3B:
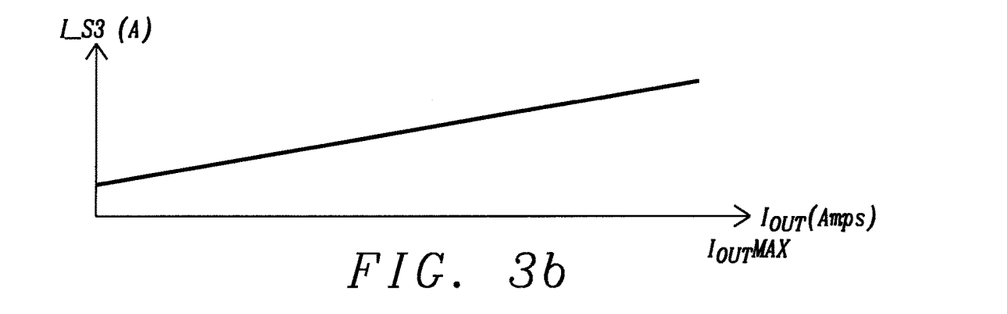
Figure 3C:
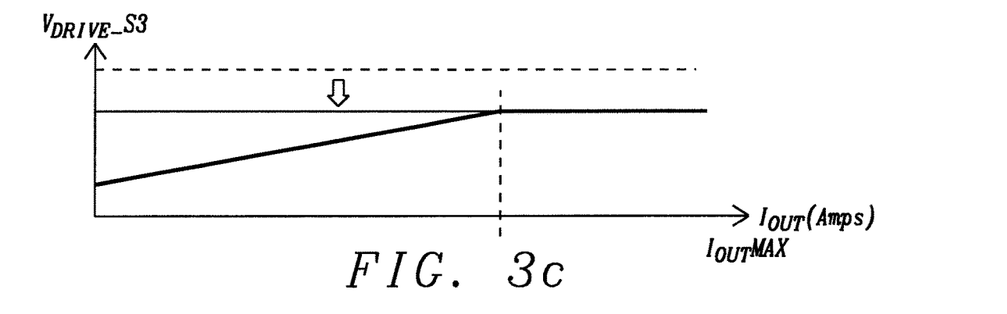
Figure 3D:
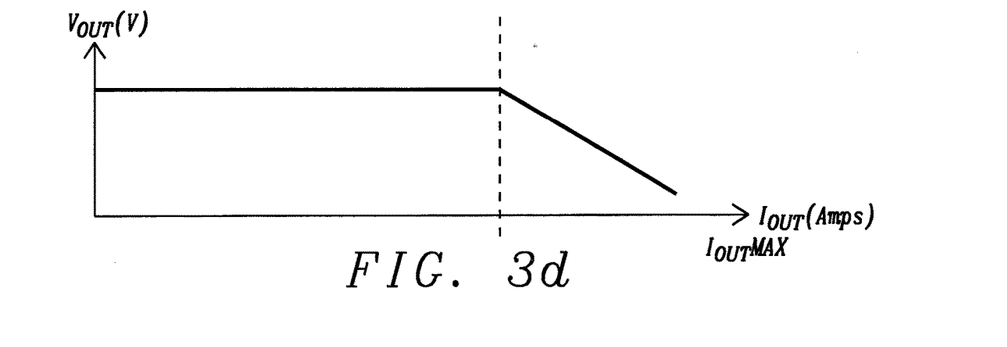

As described above, the gain ratio between the pass transistor S2 201 and the drive transistor S1 111 remains constant over the entire range of the output current I_OUT (FIG. 3a). Furthermore, the internal current I_S3 through the input transistor 113 and the gate voltage $V_{DRIVE\_S3}$ at the input transistor 113 are linearly related to the output current I_OUT (see FIGS. 3b and 3c). However, if the input voltage V_IN is not sufficiently high to provide the required gate voltage $V_{DRIVE\_S3}$ in order to maintain the linear relationship between the gate voltage $V_{DRIVE\_S3}$ and the output current I_OUT (as illustrated in FIG. 3c), the output voltage V_OUT cannot be regulated anymore in accordance to the reference voltage 108 (as illustrated in FIG. 3d). As such, a decreasing input voltage V_IN may lead to a situation, where the regulator 100 cannot regulate the output voltage V_OUT anymore.

Figure 4:
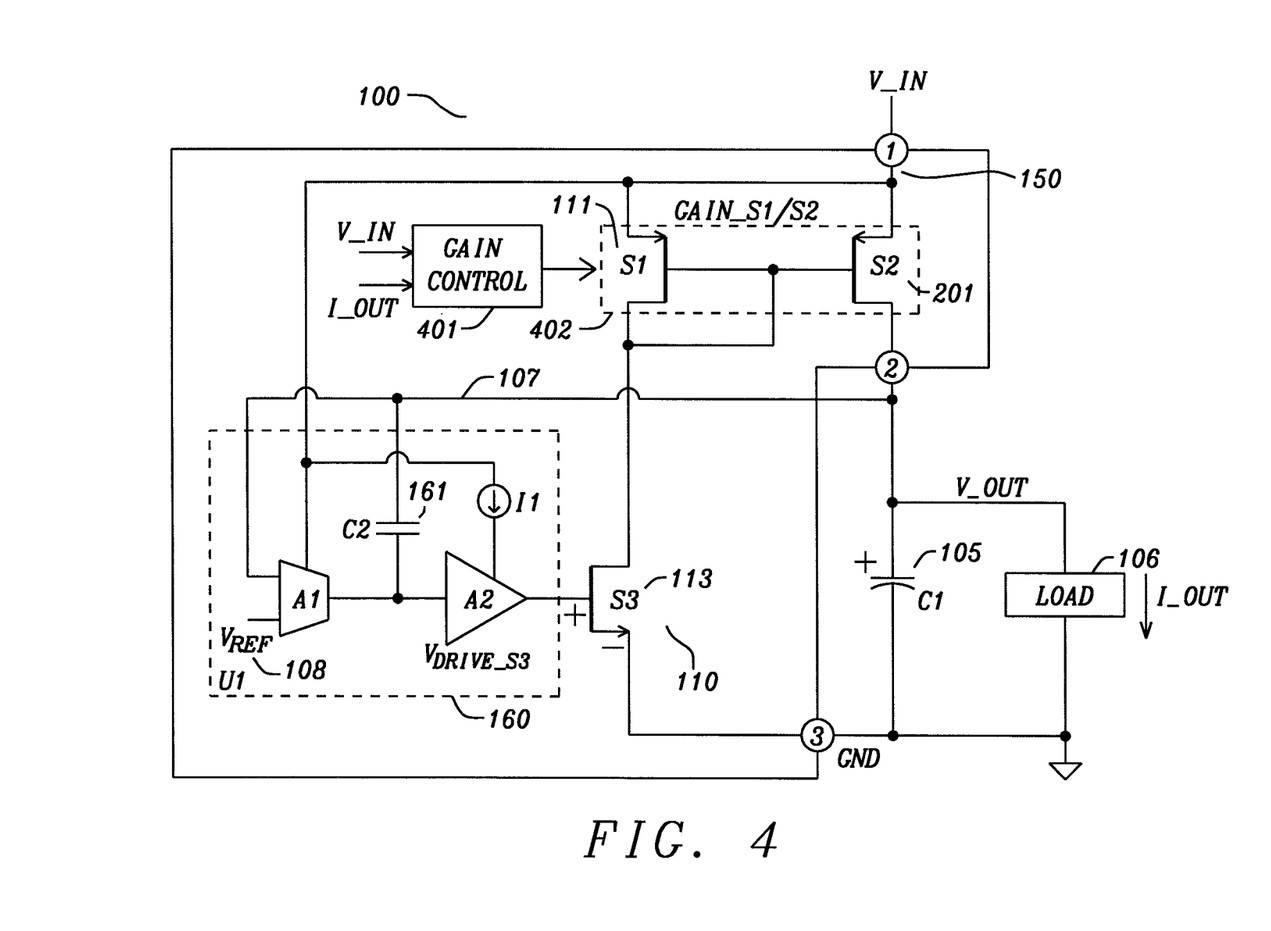
FIG. 4 shows an example block diagram of an LDO regulator comprising an output stage with an adaptable gain.

FIG. 4 illustrates a block diagram of a linear regulator 100 which comprises an output amplification stage 111, 113, 201 with an adaptable or adjustable gain. In particular, the gain ratio between the pass transistor S2 201 and the drive transistor S1 111 may be adapted. In other words, the gain of the current mirror 402, which is formed by the drive transistor S1 111 and the pass transistor S2 201 may be adapted. The adaption of the gain may be controlled using a gain control unit 401.

The gain ratio between the pass transistor S2 201 and the drive transistor S1 111 may be adapted, in order to improve the operational performance of the regulator 100. In particular, adapting the gain ratio between the pass transistor S2 201 and the drive transistor S1 111 may be used to reduce the internal power loss of the regulator 100. Furthermore, adapting the gain ratio between the pass transistor S2 201 and the drive transistor S1 111 may be used for maintaining output voltage regulation, even at reduced levels of the input voltage V_IN. The gain control unit 401 may be configured to adapt the gain ratio while balancing dynamic load and loop stability performance of the regulator 100. The gain $G_{OUT}$ may be adapted based on the level of the input voltage V_IN and/or based on the level of the output current I_OUT.

In the illustrated example of FIG. 4, the regulator 100 comprises a differential amplification stage A1 101, an intermediate amplification stage A2 for providing the gate voltage $V_{DRIVE\_S3}$ for the input transistor 113 of the output amplification stage 111, 201, 113, a Miller capacitor C2 161 and a current source I_OUT.

Example waveforms during the operation of the regulator 100 of FIG. 4 are shown in FIG. 5. The regulator 100 may comprise a high gain setting 501 with a relatively high gain ratio GAIN_S2:GAIN_S1 and a low gain setting 502 with a relatively low gain ratio $G_{OUT}$=GAIN_S2:GAIN_S1. Within a transition phase 503, the gain ratio may be adjusted smoothly between the low gain setting 502 and the high gain setting 501, as illustrated in FIG. 5a. In particular, the transition may be performed in dependence on the output current I_OUT. As the output current I_OUT increases, the gain ratio may be increased from the low gain setting 502 to the high gain setting 501 (and vice versa). It should be noted that other modes for adjusting the gain ratio GAIN_S2: GAIN_S1 may be used.

The gain ratio GAIN_S2:GAIN_S1 may be optimized for specific operating conditions. For example, at light load conditions, it is typically more advantageous to maintain a relatively low gain ratio GAIN_S2:GAIN_S1. A relatively low gain ratio allows for relatively fast response times to optimize the load transient response of the regulator 100, while maintaining a high degree of loop stability of the regulation loop. Conversely, for relatively high load currents I_OUT, it is typically advantageous to reduce the internal losses of the regulator 100 by reducing the internal current I_S3 through the driver transistor 111. This may be achieved by increasing the gain $G_{OUT}$.

Figure 5A:
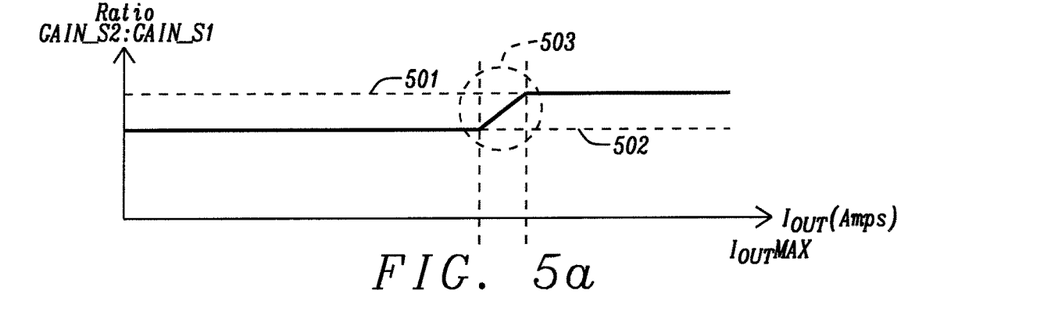
FIGS. 5a, 5b, 5c, 5d show example measurement signals during the operation of an LDO regulator having an output stage with an adaptable gain.
Figure 5B:
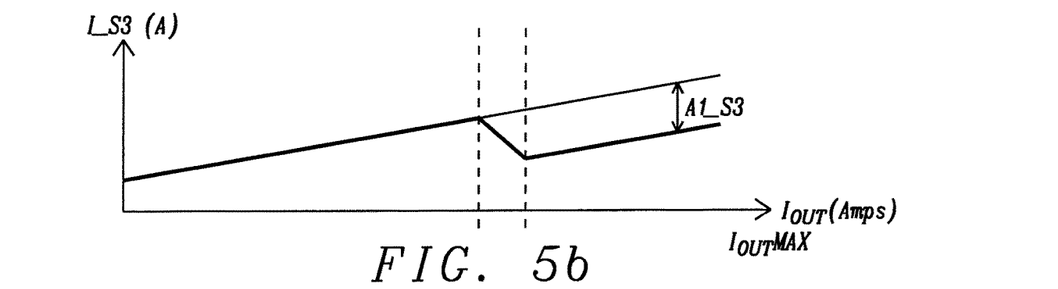

The above mentioned adaption of the gain $G_{OUT}$ is illustrated in FIG. 5b. The reduction of the internal losses of the regulator 100 due to the increase of the gain ratio GAIN_S2: GAIN_S1 is given by:

Internal Loss reduction=$\Delta I\_S3 \times (V\_S1+V\_S3)$, wherein V_S1+V_S3 (the drain-source voltages across the drive transistor 111 and the input transistor 113) corresponds to the input voltage V_IN and wherein ΔI_S3 is the reduction of the internal current I_S3 due to the increase of the gain ratio GAIN_S2:GAIN_S1.

Figure 5C:
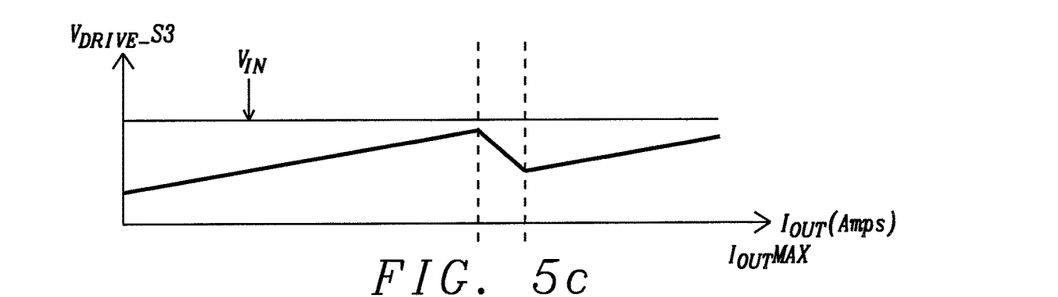
Figure 5D:
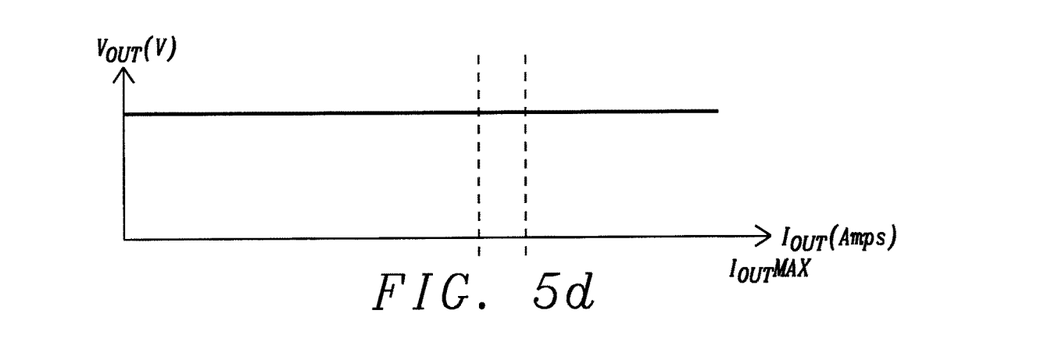

A further benefit of operating the regulator 100 with a relatively high gain ratio GAIN_S2:GAIN_S1 is obtained in situations, where the regulator 100 is operated with an input voltage V_IN which is at a similar level as the regulated output voltage V_OUT. As illustrated in FIG. 3c, for relatively low input voltages V_IN, the gate voltage $V_{DRIVE\_S3}$ of the input transistor S3 113 reaches a maximum value, which does not allow for the output voltage regulation to be maintained. On the other hand, the gate voltage $V_{DRIVE\_S3}$ of the input transistor S3 113 can be reduced when increasing the gain ratio GAIN_S2:GAIN_S1, thereby creating an additional gap between the gate voltage $V_{DRIVE\_S3}$ of the input transistor S3 113 and the input voltage V_IN (as illustrated in FIG. 5c). This gap can be used for maintaining the regulation of the output voltage V_OUT, even for relatively low input voltages V_IN (as illustrated in FIG. 5d).

FIG. 5a shows a gain transition period or interval 503, within which the gain ratio GAIN_S2:GAIN_S1 is adjusted. It is typically advantageous for a stable operation of the regulator 100 to perform a relatively gradual transition between the low gain setting 502 and the high gain setting 501 of the output amplification stage 103 (or vice versa). The gain ratio GAIN_S2:GAIN_S1 of the pass transistor 201 and the driver transistor 111 may be adjusted gradually in various different ways. An example includes linearly adjusting the gain of one or more constituting switching elements comprised within the driver transistor S1 111 and/or enabling/disabling individual switching elements of the driver transistor S1 111.

Figure 6:
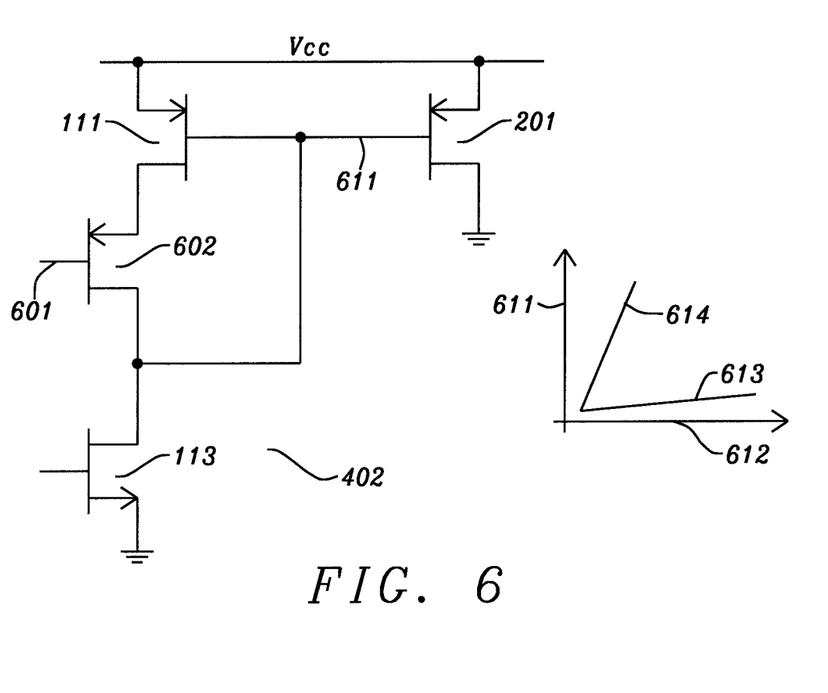
FIG. 6 illustrates an example gain control circuit for the output stage of an LDO regulator.

FIG. 6 shows an example driver transistor arrangement 111, 602 with a linearly adjustable gain. The gain may be adjusted by closing/opening the auxiliary transistor 602 (e.g. a PMOS transistor) using different gate voltages 601. FIG. 6 also illustrates the relationship between the internal current I_S3 612 and the gate voltage 611 of the pass transistor 201.

By changing the gate voltage 601 at the auxiliary transistor 602, the relationship between the gate voltage 611 and the internal current 612 may be adjusted between the first relationship 613 and the second relationship 614, thereby changing the gain ratio GAIN_S2:GAIN_S1 in a smooth manner.

Figure 7A:
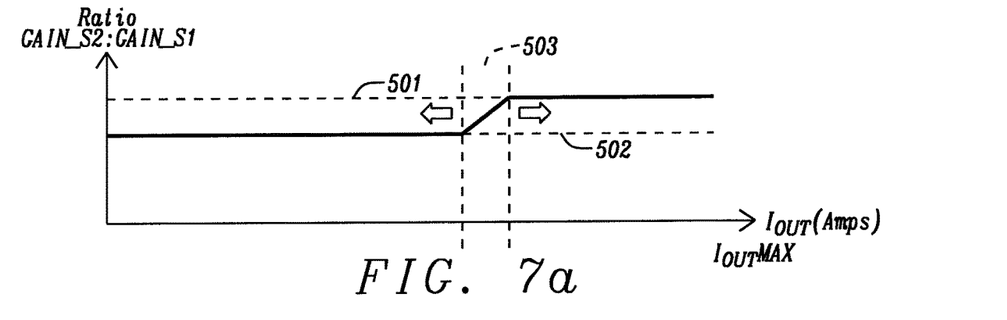
FIGS. 7a, 7b, 7c show example measurement signals during the operation of an LDO regulator having an output amplification stage with an adjustable gain.
Figure 7B:
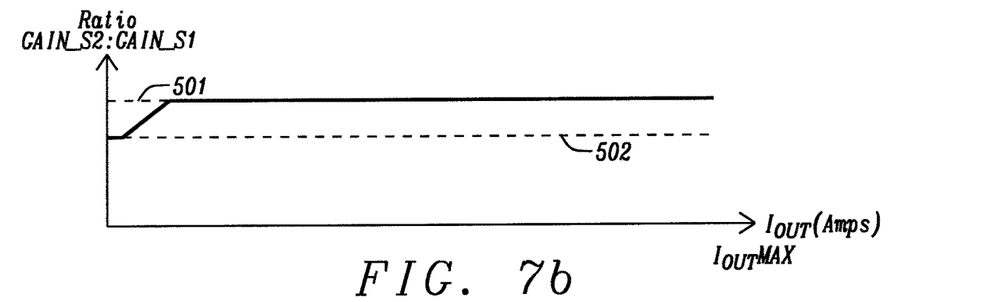
Figure 7C:
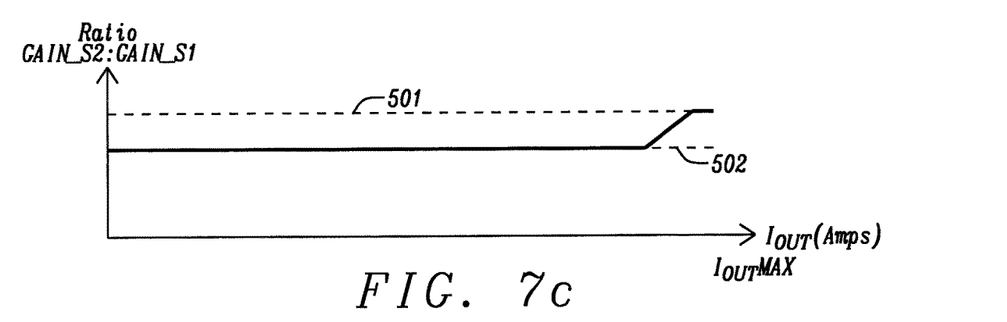

As mentioned above, it may be beneficial to operate the output amplification stage 103 with a relatively high gain ratio, when the input voltage V_IN is relatively close to the output voltage V_OUT. The difference between the input voltage V_IN and the output voltage V_OUT may be referred to as "headroom" voltage or dropout voltage. As such, by increasing the gain of the output stage 103, the dropout voltage of the regulator 100 may be reduced. In FIG. 7a, the range 503 of the output current I_OUT, at which the gain transition between the low gain setting 502 and the high gain setting 501 occurs, may be adapted in response to the amount of headroom voltage that is available. This is illustrated by the arrows in FIG. 7a. As illustrated in FIG. 7a, the transition interval 503 may be moved to different ranges of the output current I_OUT, i.e. towards lower or higher ranges. As illustrated in FIG. 7b, the transition from a low to a high gain ratio may occur at a relatively low level of the output current, when the headroom voltage is low. Alternatively, as illustrated in FIG. 7c, the transition from a low to high gain ratio may occur at a relatively high level of the output current, when the headroom voltage is large. The transition interval 503 of the gain ratio may vary back and forth as the headroom voltage increases or decreases.

Figure 8:
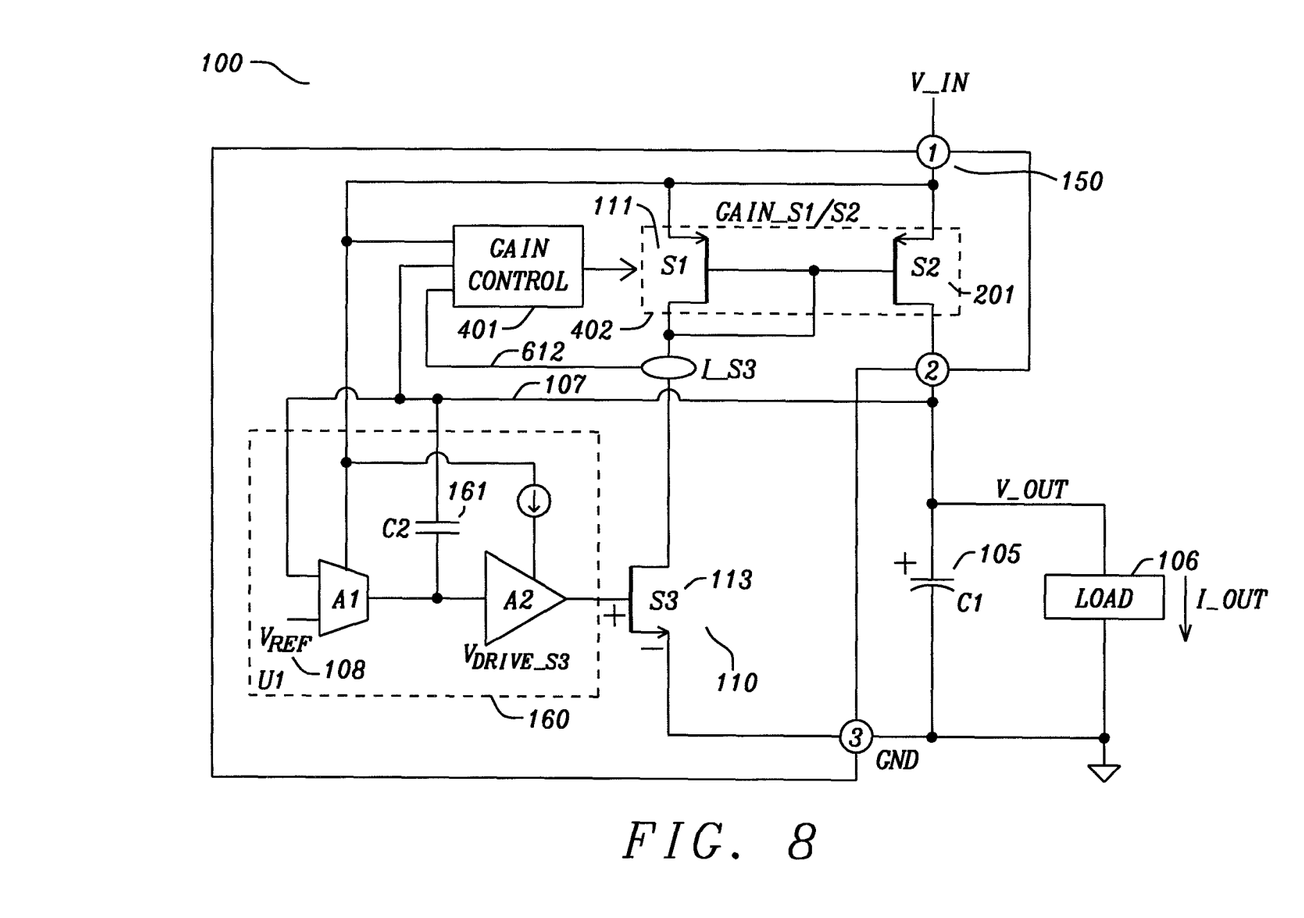
FIG. 8 illustrates a block diagram of another example LDO regulator having an output stage with an adaptable gain.

FIG. 8 illustrates a block diagram of a regulator 100 comprising a gain control unit 401 which is configured to monitor the internal current I_S3 612 and/or the output current I_OUT. Furthermore, the gain control unit 401 may be configured to monitor the input voltage V_IN and/or the output voltage V_OUT. These parameters may be sensed indirectly. For example, the output current I_OUT may be determined by sensing the drive voltage $V_{DRIVE\_S3}$ of the input transistor S3 113 and by determining the gain ratio $G_{OUT}$. The gain ratio may then be adapted in dependence of the headroom voltage and/or in dependence of the output current I_OUT.

The gain control unit 401 may be configured to vary the gain ratio $G_{OUT}$ to accommodate the feedback function of the regulator 100, i.e. notably to maintain the output voltage V_OUT in accordance to a predetermined reference voltage 108. The gain ratio $G_{OUT}$ may be set automatically as an outcome of the regulation. In the illustrated example, the gain ratio $G_{OUT}$ may be set automatically in dependence of the internal current I_S3 612 (which may also be referred to as the drive current). The gain control unit 401 may make use of a predetermined characteristic (similar to the one shown in FIG. 5a) which maps the internal current I_S3 612 and/or the output current I_OUT to the gain ratio $G_{OUT}$. The gain control unit 401 may then be configured to vary the gain ratio $G_{OUT}$ in dependence of the predetermined characteristic and the sensed internal current I_S3 612 and/or output current I_OUT.

Figure 9:
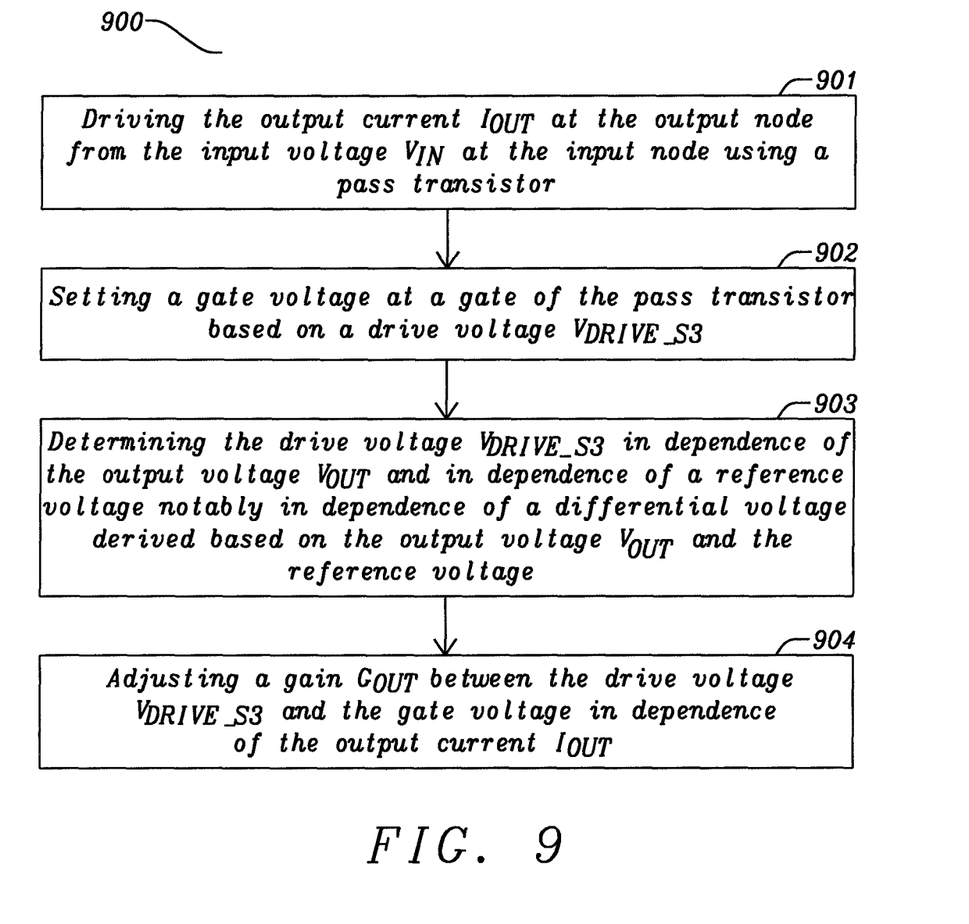
FIG. 9 shows a flow chart of an example method for operating a voltage regulator.

FIG. 9 shows a flow chart of an example method 900 for providing an output current $I_{OUT}$ at an output voltage $V_{OUT}$ at an output node of a regulator 100, based on an input voltage $V_{IN}$ at an input node 150 of the regulator 100. The method 900 comprises deriving 901 the output current $I_{OUT}$ at the output node from the input voltage $V_{IN}$ at the input node 150 using a pass transistor 201. Furthermore, the method 900 comprises setting 902 a gate voltage 611 at a gate of the pass transistor 201 based on a drive voltage $V_{DRIVE\_S3}$. In addition, the method 900 comprises determining 903 the drive voltage $V_{DRIVE\_S3}$ in dependence of the output voltage $V_{OUT}$ and in dependence of a reference voltage 108, notably in dependence of a differential voltage derived based on the output voltage $V_{OUT}$ and the reference voltage 108. Furthermore, the method 900 comprises adjusting 904 a gain $G_{OUT}$ between the drive voltage $V_{DRIVE\_S3}$ and the gate voltage 611 in dependence of the output current $I_{OUT}$. The gain $G_{OUT}$ may be proportional to a ratio of the gate voltage 611 at the pass transistor 201 over the drive voltage $V_{DRIVE\_S3}$ (at the input of the output amplification stage 103 and/or at the output of the differential amplification unit 160). The gain may be increased for an increasing output current $I_{OUT}$ (or vice versa). Alternatively or in addition, the gain may be increased for a decreasing input voltage $V_{IN}$ (or vice versa).

In the present document, a regulator 100 has been described, which allows the gain of the output stage 103 of the regulator 100 to be adapted, thereby reducing internal losses of the regulator 100 and/or enabling reduced dropout voltages.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A voltage regulator configured to provide an output current at an output voltage at an output node, based on an input voltage at an input node, wherein the voltage regulator comprises,
    an output amplification stage comprising
        a pass transistor for deriving the output current at the output node from the input voltage at the input node; and
        a driver stage configured to set a gate voltage at a gate of the pass transistor based on a drive voltage;
    wherein a gain of the output amplification stage is adjustable;
    a differential amplification unit configured to determine the drive voltage in dependence of the output voltage and in dependence of a reference voltage; and
    a gain control circuit configured to adjust the gain of the output amplification stage in dependence of the output current; wherein the gain control circuit is configured to adjust the gain by a gain delta if the output current changes by a current delta; and wherein a ratio of the gain delta and the current delta is equal to or smaller than a pre-determined transition threshold.

2. The voltage regulator according to claim 1, wherein the gain control circuit is configured to adjust the gain such that the gain increases with increasing output current and decreases with decreasing output current.

3. The voltage regulator according to claim 1, wherein the gain control circuit is configured to adjust the gain in dependence of the input voltage and/or in dependence of the output voltage, notably in dependence of a difference between the input voltage and the output voltage.

4. The voltage regulator according to claim 3, wherein the gain control circuit is configured to
    increase the gain if an absolute value of the difference between the output voltage and the input voltage decreases or if a value of the input voltage decreases; and/or
    decrease the gain if an absolute value of the difference between the output voltage and the input voltage increases or if a value of the input voltage increases.

5. The voltage regulator according to claim 1, wherein
    the output amplification stage exhibits a minimum gain value and a maximum gain value; and
    the gain control circuit is configured to adjust the gain from the minimum gain value to the maximum gain value across a transition range of values of the output current.

6. The voltage regulator according to claim 5, wherein a width of the transition range is determined based on stability measurements of the voltage regulator.

7. The voltage regulator according to claim 5, wherein a minimum current value and/or a maximum current value of the transition range depends on the input voltage and/or on an absolute value of a difference between the output voltage and the input voltage.

8. The voltage regulator according to claim 1, wherein
    the driver stage comprises a drive transistor which forms a current mirror with the pass transistor; and
    the gain of the output amplification stage is dependent on, notably equal to, a mirror ratio of the current mirror.

9. The voltage regulator according to claim 8, wherein
    the current mirror comprises an adjustable resistance between a drain of the drive transistor and the gate of the pass transistor; and
    the gain control unit is configured to control the adjustable resistance to control the gain of the output amplification stage.

10. The voltage regulator according to claim 9, wherein
    the adjustable resistance comprises an auxiliary transistor; and
    the gain control unit is configured to control a voltage which is applied to a gate of the auxiliary transistor.

11. The voltage regulator according to claim 8, wherein the gain control unit is configured to
    adjust an effective size of the drive transistor to adjust the mirror ratio of the current mirror; and/or
    adjust a gain of the drive transistor to adjust the mirror ratio of the current mirror.

12. The voltage regulator according to claim 8, wherein
    the drive transistor comprises a plurality of constituting transistors; and
    the gain control unit is configured to enable and/or disable one or more constituting transistors to adjust the mirror ratio of the current mirror.

13. The voltage regulator according to claim 1, wherein
    the driver stage comprises an input transistor which is controlled by the drive voltage to set an internal current of the driver stage; and
    the gain of the output amplification stage is proportional to a ratio of the output current and the internal current.

14. A method for providing an output current at an output voltage at an output node, based on an input voltage at an input node, wherein the method comprises,
    deriving the output current at the output node from the input voltage at the input node using a pass transistor;
    setting a gate voltage at a gate of the pass transistor based on a drive voltage;
    determining the drive voltage in dependence of the output voltage and in dependence of a reference voltage; and adjusting a gain between the drive voltage and the gate voltage in dependence of the output current; wherein the gain control circuit is configured to adjust the gain by a gain delta if the output current changes by a current delta; and wherein a ratio of the gain delta and the current delta is equal to or smaller than a pre-determined transition threshold.

15. The method according to claim 14, further comprising the step of:

adjusting the gain such that the gain increases with increasing output current and decreases with decreasing output current by the gain control circuit.

16. The method according to claim 14, further comprising the step of:

adjusting the gain in dependence of the input voltage and/or in dependence of the output voltage, notably in dependence of a difference between the input voltage and the output voltage by the gain control circuit.

17. The method according to claim 16, further comprising the steps of:

increasing the gain if an absolute value of the difference between the output voltage and the input voltage decreases or if a value of the input voltage decreases by the gain control circuit; and/or decreasing the gain if an absolute value of the difference between the output voltage and the input voltage increases or if a value of the input voltage increases by the gain control circuit.

18. The method according to claim 14, wherein the output amplification stage exhibits a minimum gain value and a maximum gain value; and the gain control circuit adjusts the gain from the minimum gain value to the maximum gain value across a transition range of values of the output current.

19. The method according to claim 18, wherein a width of the transition range is determined based on stability measurements of the voltage regulator.

20. The method according to claim 18, wherein a minimum current value and/or a maximum current value of the transition range depends on the input voltage and/or on an absolute value of a difference between the output voltage and the input voltage.

21. The method according to claim 14, wherein the driver stage comprises a drive transistor which forms a current mirror with the pass transistor; and the gain of the output amplification stage is dependent on, notably equal to, a mirror ratio of the current mirror.

22. The method according to claim 21, wherein the current mirror comprises an adjustable resistance between a drain of the drive transistor and the gate of the pass transistor; and the gain control unit controls the adjustable resistance to control the gain of the output amplification stage.

23. The method according to claim 22, wherein the adjustable resistance comprises an auxiliary transistor; and the gain control unit controls a voltage which is applied to a gate of the auxiliary transistor.

24. The method according to claim 21, comprising the steps of:

adjusting an effective size of the drive transistor to adjust the mirror ratio of the current mirror by the gain control unit; and/or adjusting a gain of the drive transistor to adjust the mirror ratio of the current mirror by the gain control unit.

25. The method according to claim 21, wherein the drive transistor comprises a plurality of constituting transistors; and the gain control unit enables and/or disables one or more constituting transistors to adjust the mirror ratio of the current mirror.

26. The method according to claim 14, wherein the driver stage comprises an input transistor which is controlled by the drive voltage to set an internal current of the driver stage; and the gain of the output amplification stage is proportional to a ratio of the output current and the internal current.

* * * * *